(12) United States Patent
Myhre et al.

(10) Patent No.: US 11,856,731 B2
(45) Date of Patent: Dec. 26, 2023

(54) OUTDOOR POWER SUPPLY SYSTEM INCLUDING A PASSIVE COOLING SYSTEM

(71) Applicant: DELTA ELECTRONICS (NORWAY) AS, Drammen (NO)

(72) Inventors: Erik Myhre, Drammen (NO); Håkon Hafnor, Drammen (NO); Kjetil Hagen, Drammen (NO); Jan Tore Brastad, Drammen (NO); Christine Amer, Drammen (NO)

(73) Assignee: DELTA ELECTRONICS (NORWAY) AS, Drammen (NO)

( * ) Notice: Subject to any disclaimer, the term of this patent is extended or adjusted under 35 U.S.C. 154(b) by 0 days.

(21) Appl. No.: 17/353,419

(22) Filed: Jun. 21, 2021

(65) Prior Publication Data
US 2021/0400847 A1   Dec. 23, 2021

(30) Foreign Application Priority Data
Jun. 23, 2020  (EP) ...................................... 20181657

(51) Int. Cl.
*H05K 7/20*   (2006.01)
*H02B 1/56*   (2006.01)
*H02B 1/30*   (2006.01)

(52) U.S. Cl.
CPC ......... *H05K 7/20409* (2013.01); *H02B 1/308* (2013.01); *H02B 1/56* (2013.01)

(58) Field of Classification Search
None
See application file for complete search history.

(56) References Cited

U.S. PATENT DOCUMENTS

| 6,501,662 | B2 * | 12/2002 | Ikeda | ................... | H05K 7/1432 |
| | | | | | 361/752 |
| 8,164,904 | B2 * | 4/2012 | Matz | .................... | H01L 25/071 |
| | | | | | 361/709 |

(Continued)

FOREIGN PATENT DOCUMENTS

| CN | 201467115 U | 5/2010 |
| CN | 107231039 B | 9/2019 |
| EP | 3361566 A1 | 8/2018 |
| WO | WO2015117494 A1 | 8/2015 |

OTHER PUBLICATIONS

EESR of EP20181657.
(Continued)

*Primary Examiner* — Courtney L Smith
(74) *Attorney, Agent, or Firm* — J.C. PATENTS

(57) ABSTRACT

The present disclosure relates to a power supply system (1) including a main unit (10) including a protective main housing (11) and a distribution circuit (20) disposed in the protective main housing (11); a first module unit (30a) including a first protective module housing (31a) and a first electric module (40a) disposed in the first protective module housing (31a). The system also includes a passive cooling system (70) for cooling of the main unit (10) and the first module unit (30a). A first protective connection system (CS1) and a second protective connection system (CS2) is also a part of the system, wherein the first protective connection system (CS1) is configured to provide a releasable electrical and mechanical connection between the main unit (10) and the first module unit (30a). The passive cooling system (70) includes cooling fins (71) disposed on an outer surface of the first protective module housing (31a).

17 Claims, 21 Drawing Sheets

(56) References Cited

U.S. PATENT DOCUMENTS

| | | | |
|---|---|---|---|
| 8,861,186 B2 | 10/2014 | Chuang | |
| 9,167,712 B2 | 10/2015 | Lv | |
| 9,642,284 B2 | 5/2017 | Lv | |
| 9,853,421 B2* | 12/2017 | Binder | H01S 5/4025 |
| D810,078 S | 2/2018 | Kikuchi | |
| 10,772,187 B2* | 9/2020 | Mitsui | H05K 1/0201 |
| 11,218,081 B2* | 1/2022 | Deguchi | H05K 7/1427 |
| 11,246,244 B2* | 2/2022 | Denk | H02M 7/003 |
| 11,431,257 B2* | 8/2022 | Nagelmüller | H05K 7/2089 |
| 2019/0052081 A1* | 2/2019 | Rainbow | H02J 3/381 |

OTHER PUBLICATIONS

D3: "Compact versatile HE system for outdoor applications", Eltek, Jan. 1, 2019, XP055739332, Retrieved from the Internet: URL: https://www.eltek.com/globalassets/imported-documents/open/ds-mfgc0212.00x.ds3-1-2-1.pdf.

D4: "Chameleon Standalone—High efficiency and reliable IP65 power modules", Eltek, Dec. 31, 2018, XP055738964, Retrieved from the Internet: URL: https://www.eltek.com/globalassets/imported-documents/open/ds-241125.1xx.ds3-1-4, 1-1.pdf.

D2: "Chameleon PS Systems Documents", Eltek, Dec. 2, 2014, XP055738977, Retrieved from the Internet: URL: https://www.eltek.com/globalassets/imported-documents/open/UDOC-356848.003-1-1s-1.pdf.

EESR of EP201816576.

D3: "Compact versatile HE system for outdoor applications", Eltek, 2019.

D4: "High efficiency and reliable IP65 power modules", Eltek, 2018.

"China 2 Ports Outdoor Lightning Poe Midspan Injector", product description.

"China 3G_4G_5g WLAN Base Station Poe Power Supply Solution", product description.

* cited by examiner

OUTDOOR POWER SUPPLY SYSTEM INCLUDING A PASSIVE COOLING SYSTEM

CROSS-REFERENCE TO RELATED APPLICATION

This application claims priority to European Patent Application No. 20181657.6, filed on Jun. 23, 2020, which is hereby incorporated by reference in its entirety.

TECHNICAL FIELD

The present disclosure relates to an outdoor power supply system including a passive cooling system.

BACKGROUND

Outdoor power supply systems are commonly used to supply power to outdoor power consuming systems. One example of such outdoor power consuming systems is telecom equipment, such as telecom base stations. Such a telecom base station is typically supplied with a 48V direct current (DC) voltage delivered from a power supply system located adjacent to, or in the proximity of, the base station.

The power supply system may include an alternating current (AC)/DC converter for converting an AC voltage from the AC mains (or a fossil-fueled AC generator etc.).

Alternatively, the power supply system may include a DC/DC converter for converting a DC voltage (from a solar panel system, or another type of DC power source).

The power supply system may further include rechargeable batteries to provide UPS (uninterrupted power supply) functionality.

The outdoor power supply system further includes a cabinet in which electrical equipment is protected from the environment. The cabinet provides protection from fine particles (dust, sand etc.) and humidity (rain, snow etc.). FIG. 1 shows one such prior art cabinet, referred to as the Type 4 Outdoor cabinet and described in the datasheet "Outdoor telecom power cabinet (Type 4)" issued by Eltek ASA. This cabinet has an IP code 55 (Ingress Protection code as defined in IEC standard 60529). Power cables, such as AC or DC input power cables and DC output cables, are guided between the inside and outside of the cabinet through its top side or bottom side.

FIG. 2a shows a prior art AC/DC converter module referred to as the Eltek Flatpack 2 SHE converter and described in the brochure "SHE is so cool: Efficiency taken to the next level". There are today two versions, supplying 2000 W and 3000 W respectively. The converter has a power efficiency of about 98%. The electrical and electronic components of the converter module is provided within a cover, as indicated in FIG. 2a. The purpose of the cover is to provide protection against electrical shock and for EMI purposes. One or several such converters may be mounted in a rack within the cabinet shown in FIG. 1.

As the converter and other parts of the power supply system generates heat, a cooling system is needed to cool the air within the cabinet. The cooling system may be a heat exchanger, an air conditioner or a fan-filter. The cooling system has several disadvantages; it reduces the overall power efficiency, it increases the size of the cabinet, it increases the costs of the overall power supply system and it reduces the reliability of the overall system. As shown in FIG. 2a, also the converter itself has a fan on its front side to provide a cooling air flow through the converter.

FIG. 2b shows a prior art AC/DC converter where a power converter module as in FIG. 2a is provided within a metal housing with cooling fins. The housing has an IP65 rating. This AC/DC converter is marketed by Eltek ASA under the name "Chameleon" and is described in the datasheet "Chameleon Standalone 48/650 HE". This converter is passively cooled and hence has a reduced cost due to the lack of an active cooling system. The housing is made of an extruded aluminum alloy, where the printed circuit board (PCB) with all its electrical components is inserted into either the top end opening or the bottom end opening of the housing. The end openings are thereafter closed by a top cover and a bottom cover, the bottom cover including cable connectors for input/output power. This AC/DC converter has an increased manufacturing cost due to the cumbersome assembly procedure.

FIG. 2c shows a prior art AC/DC power system including two converters of FIG. 2b connected together as a power core, the system further including a battery unit. This AC/DC power system is marketed by Eltek ASA and is described in the datasheet "Chameleon PS Systems-Compact-based Power Supply System". It is also vulnerable for theft and vandalism. The system is also limited in how much power it can supply. This system also has an increased manufacturing cost.

One object of the present disclosure is to improve the power efficiency of outdoor power supply systems. Another object is to reduce the size and costs of such of outdoor power supply systems. Yet another object is to provide a flexible and reconfigurable power supply system.

SUMMARY

The present disclosure relates to a power supply system including:
- a main unit including a protective main housing and a distribution circuit disposed in the protective main housing;
- a first module unit including a first protective module housing and a first electric module disposed in the first protective module housing;
- a passive cooling system for cooling of the main unit and the first module unit;
- a first protective connection system and a second protective connection system, wherein the first protective connection system is configured to provide a releasable electrical and mechanical connection between the main unit and the first module unit;
- wherein the passive cooling system includes cooling fins disposed on an outer surface of the first protective module housing.

In one aspect, the power supply system includes:
- a second module unit including a second protective module housing and a second electric module disposed in the second protective module housing;
- wherein the second protective connection system is configured to provide a releasable electrical and mechanical connection between the main unit and the second module unit;
- wherein the passive cooling system includes cooling fins disposed on an outer surface of the second protective module housing.

Alternatively, the power supply system includes a protective blinding unit; wherein the second protective connection system is configured to provide a releasable mechanical connection between the main unit and the protective blinding unit.

In one aspect, the first module unit is a converter module unit, wherein the electric module is an active power converter for converting a first type of power to a second type of power.

In one aspect, wherein the second module unit is a battery module unit, wherein the electric module includes a rechargeable battery.

The battery module unit does not necessarily need cooling fins on the outside of its housing.

Alternatively, also the second module unit is a converter module unit, wherein the electric module is an active power converter. The second module unit may be of the same type as the first module unit or it may be of a different type.

In one aspect, the protective module housing includes:
a first module housing section;
a second module housing section;
a module sealing element sealingly engaged between the first module housing section and the second module housing section, where the module sealing element is oriented in a vertical module sealing plane during operation of the power supply system.

In one aspect, when the module unit is a converter module unit, the printed circuit board of the electric module is parallel with the module sealing plane.

In one aspect, the power supply system is configured to allow at least one of the following during operation of the power supply system:
connect a further module unit to the main unit;
disconnect a module unit from the main unit.

In one aspect, the module unit is mechanically secured to the main unit by means of a securing element accessible from the inside of the main housing.

In one aspect, the module housing is made of a thermally conducting material and is a part of the cooling system.

In one aspect, the first protective connection system and/or the second protective connection system includes a first connector device, a second connector device and a sealing element; wherein the first connector device includes:
a first mechanical connector configured to be secured to the protective main housing;
a first electrical connector configured to be connected to the distribution circuit;
a first sealing surface circumferentially surrounding the first mechanical connector and the first electrical connector;
wherein the second connector device includes:
a second mechanical connector configured to be secured to the protective module housing;
a second electrical connector configured to be connected to the converter module;
a second sealing surface circumferentially surrounding the mechanical connector and the electrical connector;
wherein, when the module unit and the main unit are connected to each other:
the first and second mechanical connectors are connected to each other;
the first and second electrical connectors are connected to each other; and
the sealing element is sealingly engaged between the first and second sealing surfaces.

In one aspect, the second mechanical connector includes a securing opening; the first mechanical connector includes a securing element being secured to the securing opening when the module unit and the main unit are connected to each other; wherein the securing element is accessible from within the protective main housing.

In one aspect, the first mechanical connector includes a guiding opening; and the second mechanical connector includes a guiding element being inserted into to the guiding opening when the module unit and the main unit are connected to each other.

In one aspect, the first sealing surface is provided as a part of the protective main housing and the second sealing surface is provided as a part of the protective module housing.

In one aspect, the first sealing surface is provided as part of a groove in the protective main housing; and the second sealing surface is provided as a ridge protruding from the second protecting housing.

In one aspect, the first connector device includes a first heat-conducting element;
the second connector device includes a second heat-conducting element; wherein the first and second heat-conducting elements are provided in contact with each other when the module unit and the main unit are connected to each other.

In one aspect, the first heat-conducting element is provided as a part of the protective main housing and the second heat-conducting element is provided as a part of the protective module housing.

In one aspect, the first heat-conducting element is provided vertically below the second heat-conducting element during operation of the power supply system.

In one aspect, the second connector device includes a lip circumferentially surrounding the second heat-conducting element, where the lip is protruding in an axial direction away from the second sealing surface.

In one aspect, during operation of the power supply system, the first connector device is provided on a top face of the protective main housing and the second connector device is provided on a bottom face of the protective module housing.

In one aspect, wherein during operation of the power supply system, the first mechanical connector and the first electrical connector are facing upwardly and the second mechanical connector and the second electrical connector are facing downwardly.

In one aspect, the first and second sealing surfaces are oriented in a horizontal plane during operation of the power supply system.

In one aspect, the first connector device includes a first ventilation channel; the second connector device includes a second ventilation channel aligned with the first ventilation channel when the module unit and the main unit are connected to each other.

In one aspect, the system further includes a passive cooling system for cooling of the main unit and the module unit.

In one aspect, the passive cooling system includes cooling fins provided on the outer surface of the protective module housing.

In one aspect, the first mechanical connector includes a first part of a mechanical coding system; and the second mechanical connector includes a second part of the mechanical coding system; wherein connection of the module unit to the main unit is possible only if the first part of the mechanical coding system fits the second part of the mechanical coding system.

In one aspect, the module housing is manufactured together with the converter module housing in a die casting process or a machining process. Preferably, the module housing is made of aluminum or an aluminum alloy. The cooling fins of the passive cooling system may be manufactured together with the converter module housing in a die casting process or a machining process.

In one aspect, the protective main housing includes one or two handles for carrying the main unit. Also the protective module housing may include one or two handles for carrying the module unit.

In one aspect, the protective main housing and the protective module housing includes carrying openings to which strings, ropes, etc. may be connected, either directly or via a spiral ring, key ring, a carabiner hook etc. Such carrying openings makes it easier to hang off the housings temporarily during installation or reconfiguration of the power supply system above ground.

The above power supply system needs the passive cooling system during operation of the power supply system, i.e. when the electric module is supplied with electric power and is performing active power conversion. During manufacturing, transportation, storage etc., that is before the power supply system is installed and power is turned on, no heat is produced, and no cooling is needed. The term "during operation of the power supply system" is therefore used herein to specify preferred, but not necessarily essential, technical features relevant when the power is turned on. During operation of the power supply system, at least one module unit and the main unit are connected to each other.

In one aspect, the cooling fins are oriented in a vertical direction. In one aspect, the cooling fins are protruding horizontally from the outer surface of the protective module housing.

In one aspect, the power supply system further includes cable lead-through provided on the bottom face of the protective main housing. Consequently, the cable lead-through will be partially shielded for precipitation by the main housing. In one aspect the cable lead-through is a protective cable lead-through.

In one aspect, the distribution circuit includes cable connectors, circuit breakers and fuses. The distribution circuit may also include a control system for controlling the power flow through the power supply system.

In one aspect, the power supply system includes a protective ventilation device. The ventilation device equalizes the air pressure within the protective housings with the air pressure outside of the protective housings. In addition, also air humidity may be equalized towards the environment by means of the protective ventilation device. The protective ventilation device may include a membrane, for example an expanded Poly Tetra Fluoro Ethylene (PTFE) membrane. Such ventilation devices are sold under the name Gore® Vents and are considered to be well known for a skilled person. The protective ventilation device may be provided on the rear side of the main housing.

In one aspect, the power supply system includes one or more mounting devices for mounting the power supply system to a structure, such as a wall, a pole, a tower etc. The mounting devices may be provided on the rear side of the main housing. Preferably, the mounting devices are accessible from within the main housing. This will prevent or delay theft or tampering.

In one aspect, the converter module has a nominal power of 1500-3000 W, preferably 1500-2000 W.

In one aspect, the module unit is configured to convert a first type of power to a second type of power. The first type of power may be a 230 VAC type of power, a variating DC type of power, a fixed DC type of power. The first type of power may often be referred to as input power inputted to the power supply system.

The second type of power may be a 48 VDC type of power, or another type of power as required by the load. The second type of power may often be referred to as output power outputted from the power supply system.

It should be noted that the converter module may be configured to convert power between more than two types of power. For example, one converter module may convert both a solar DC type of power and an AC type of power to a fixed DC type of power. In addition, bi-directional power converters are commonly known to be able to transfer power in both directions.

The term "protective" is referring to how electrical equipment needs to be protected from the outdoor environment, for example from fine particles and humidity. Hence, the term "protective" may be interpreted as "protective against the outdoor environment". As mentioned in the introduction above, equipment for protection of electrical equipment is classified with Ingress Protection code as defined in IEC standard 60529. The embodiments described herein are designed for IP code 65, which is typically required for outdoor power supply systems in Scandinavian countries. Other locations may require other IP codes, for example lower/higher protection against fine particles and lower/higher protection against humidity.

BRIEF DESCRIPTION OF DRAWINGS

Embodiments of the disclosure will now be described in detail with respect to the enclosed drawings, wherein.

DESCRIPTION OF EMBODIMENTS

Figure 1:
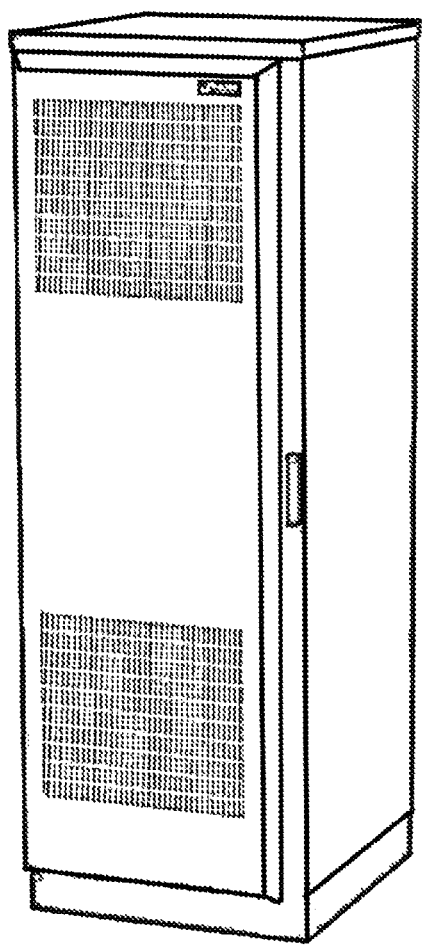
FIG. 1 shows a prior art housing of an outdoor power supply system, the housing being a cabinet.
Figure 2A:
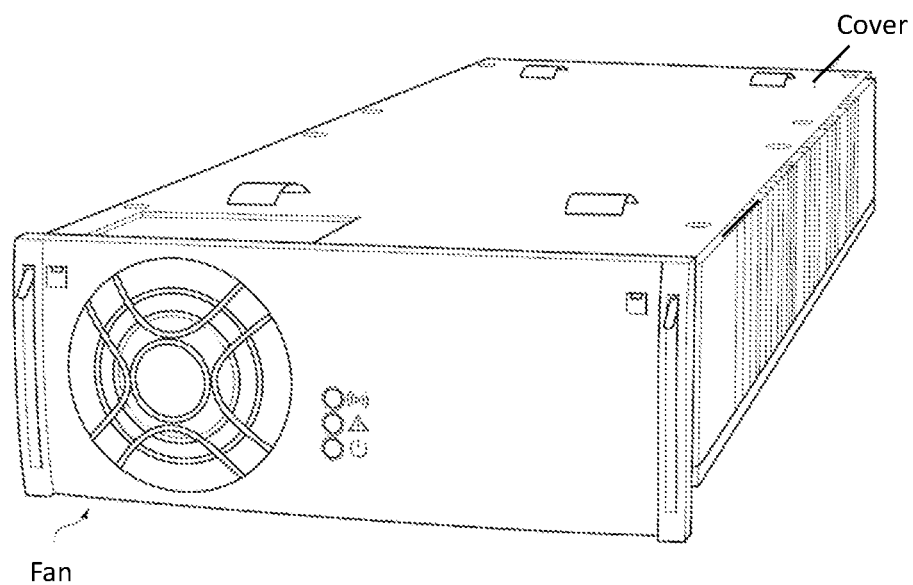
FIG. 2a illustrates a converter module used in the power supply system of FIG. 1.
Figure 2B:
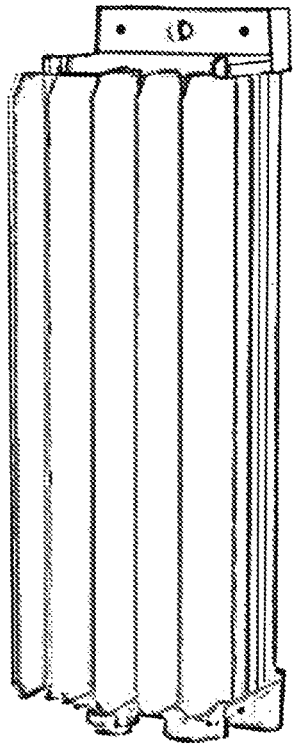
FIG. 2b illustrates a prior art passively cooled converter module.
Figure 2C:
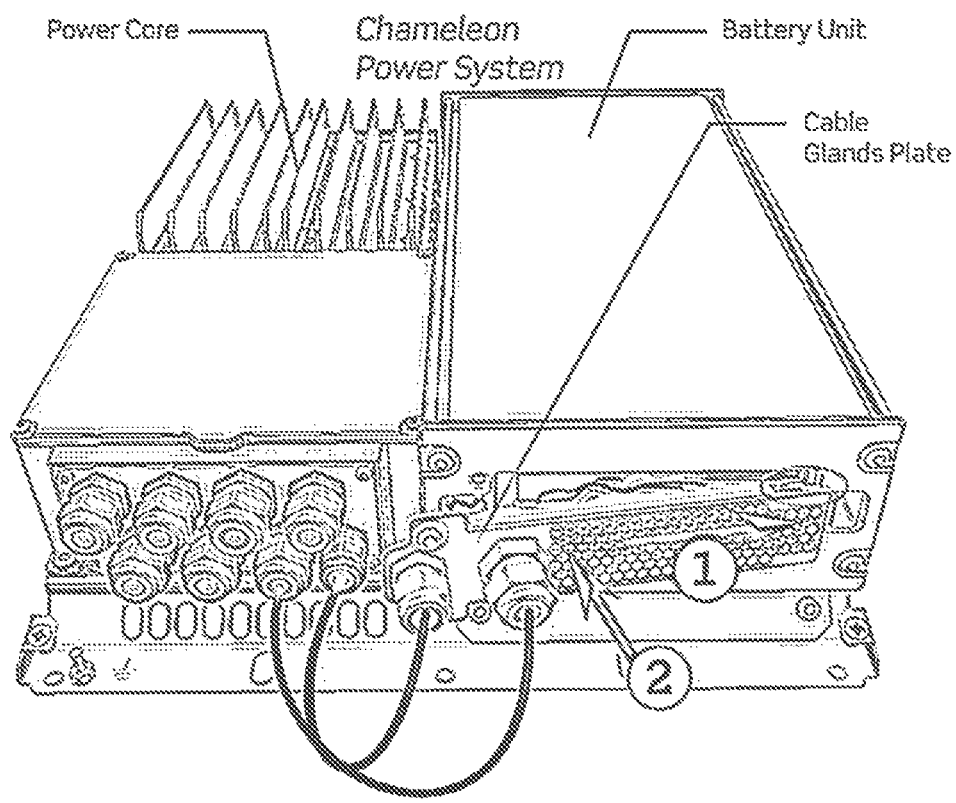
FIG. 2c illustrates a prior art power supply system with two such passively cooled converter modules.
Figure 3A:
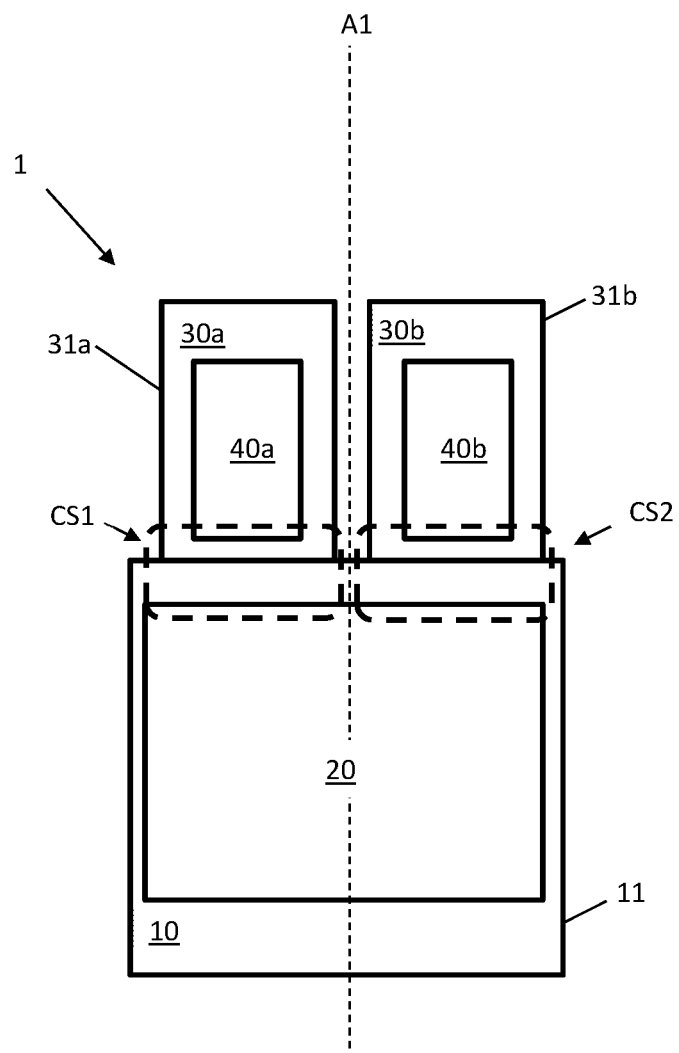
FIG. 3a illustrates schematically a front view of a first embodiment of the power supply system having two module units.

It is now referred to FIG. 3a. Here, a power supply system 1 is illustrated, including a main unit 10 and two module units 30. These two module units 30 are referred to as the first module unit 30a and the second module unit 30b. The first module unit 30a is releasably connected to the main unit 10 by means of a first protective connection system CS1 while the second module unit 30b is releasably connected to the main unit 10 by means of a second protective connection system CS2, both indicated as dashed rectangles in FIG. 3a. The protective connection systems CS1, CS2 are used as connection interfaces and configured to provide a releasable electrical and mechanical connection between the main unit 10 and the respective module units 30a, 30b.

The main unit 10 includes a protective main housing 11 and a distribution circuit 20 disposed in the protective main housing 11. The first module unit 30a includes a first protective module housing 31a and a first electric module 40a disposed in the first protective module housing 31a, while the second module unit 30b includes a second protective module housing 31b and a second electric module 40b disposed in the second protective module housing 31b.

Figure 4A:
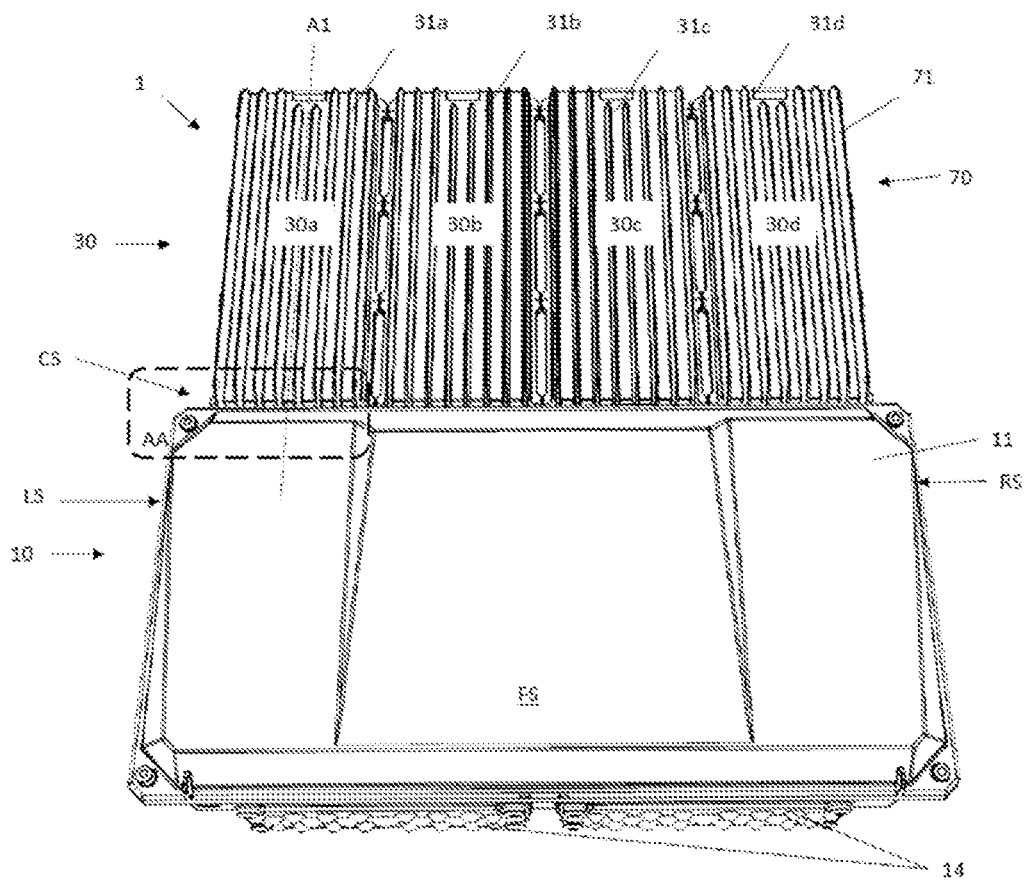
FIG. 4a shows a front view of a first embodiment of an outdoor power supply system.
Figure 4B:
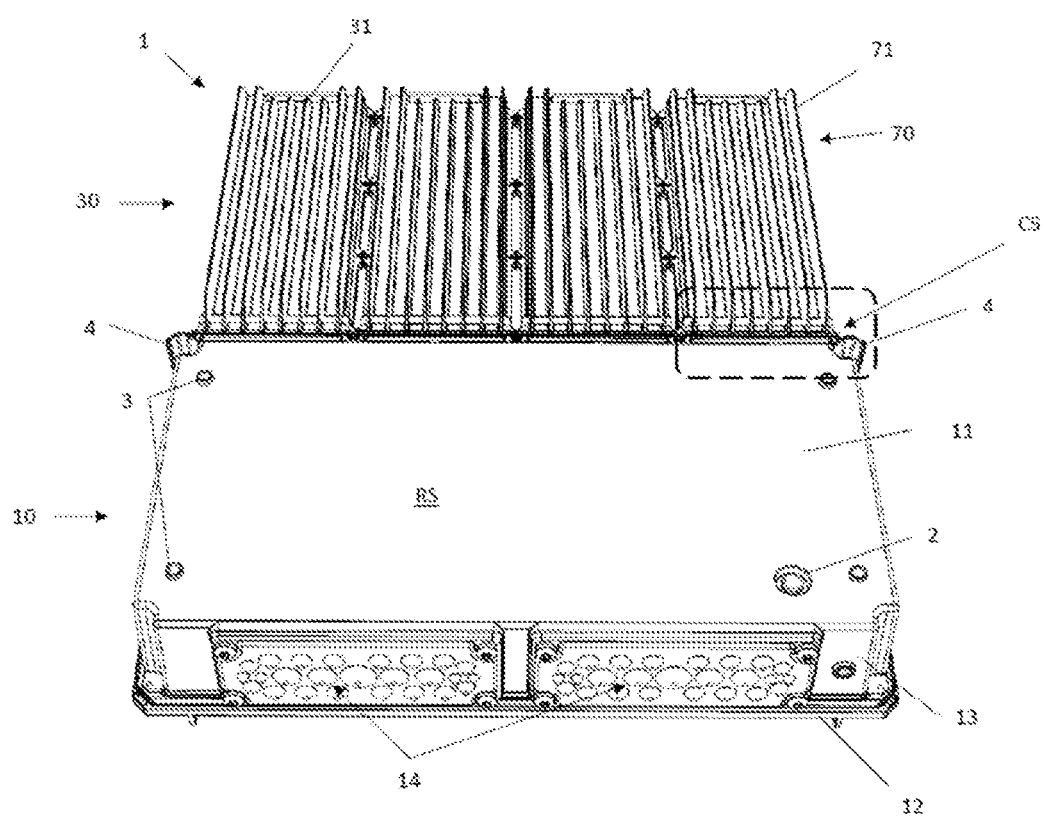
FIG. 4b shows a rear view of the first embodiment.

It is now referred to FIG. 4a and FIG. 4b, in which another embodiment of a power supply system 1 is shown. Here, the main unit 10 is connected to four module units 30a, 30b, 30c, 30d. It should be noted that only one of the connection systems CSs are indicated in FIGS. 4a and 4b. A center axis A1 of the first module unit 30a is also indicated in FIG. 4a. As it will be apparent from the description below, the center axis A1 is typically oriented in the vertical direction when the power supply system 1 is in operation. Based on such an orientation, the main unit 10 is further indicated with its front side FS, left side LS, right side RS and rear side RS in FIGS. 4a and/or 4b.

Only the main housing 11 and the four module housings 31 are shown in FIGS. 4a and 4b. The module housings 31 are shown to be a part of a cooling system 70 with cooling fins 71. This will be described further in detail below.

Figure 9:
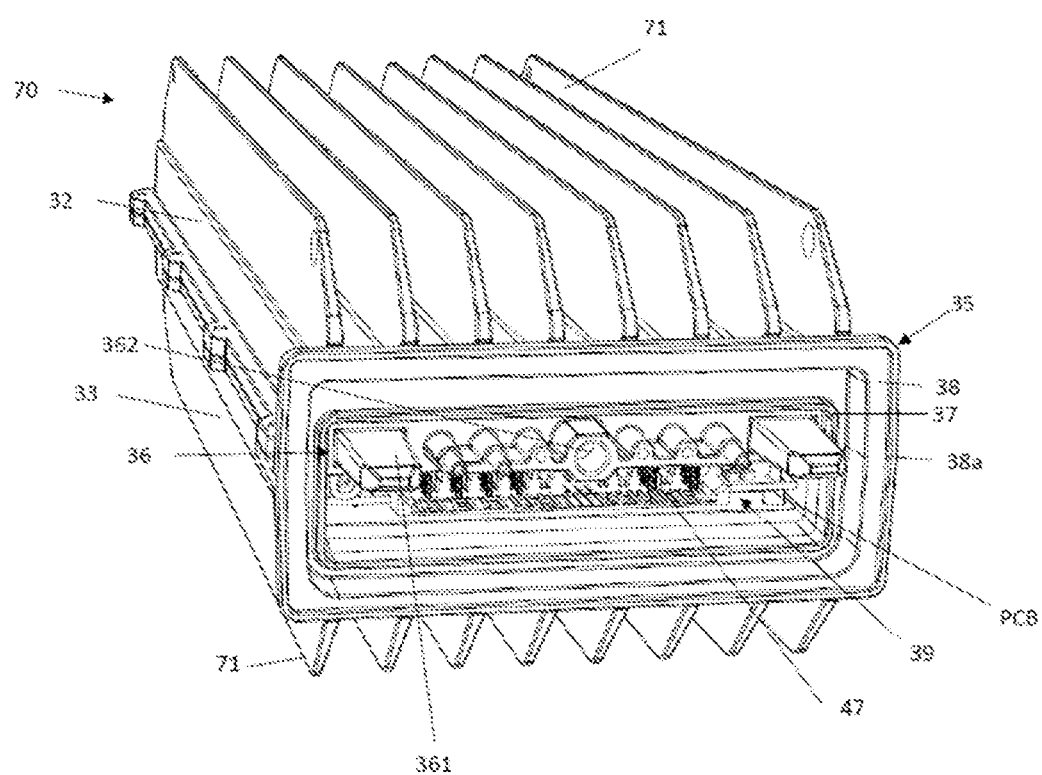
FIG. 9 corresponds to FIG. 8, here the mechanical connector and the electrical connector of the second connection device are shown.
Figure 10:
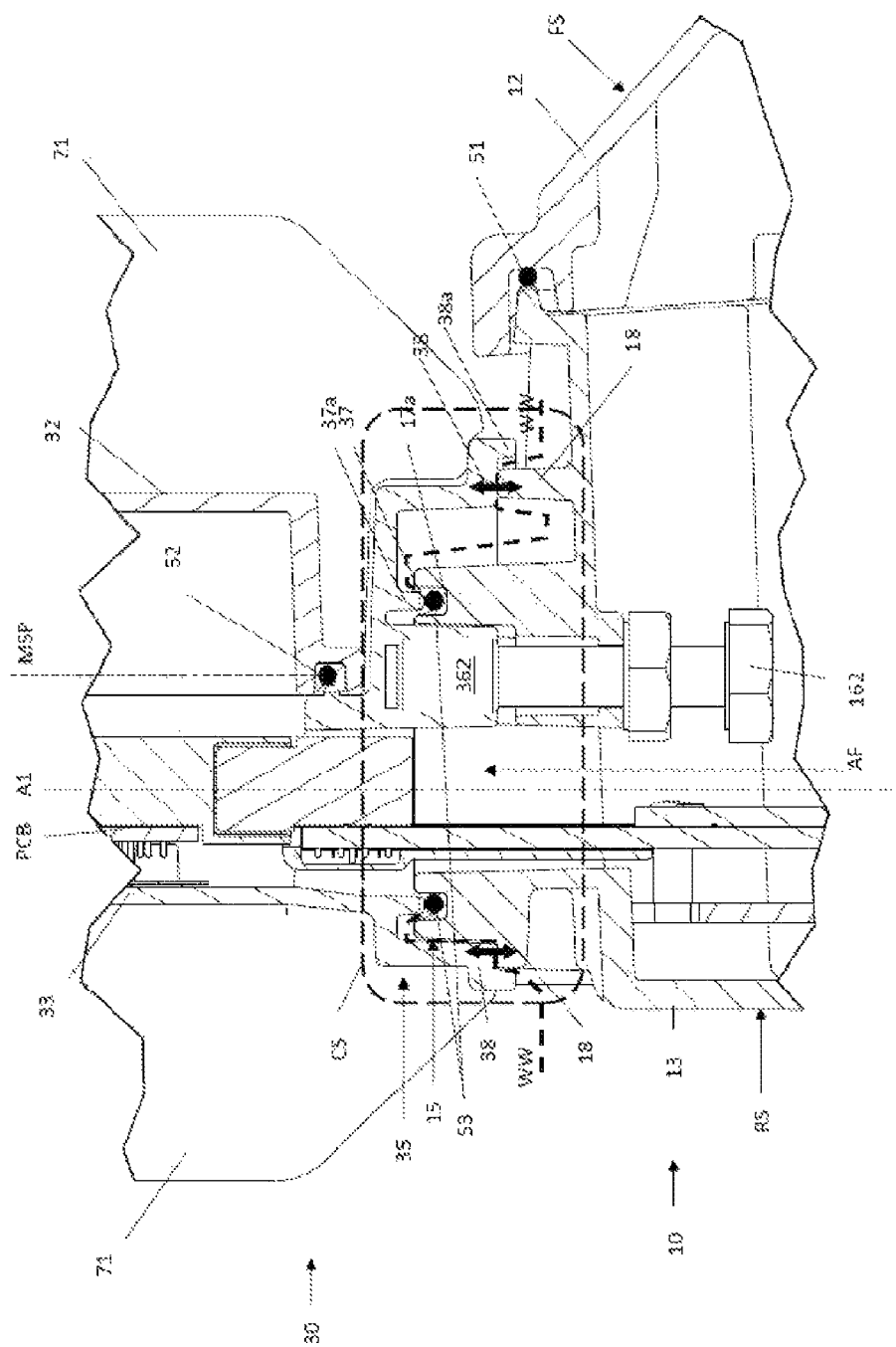
FIG. 10 is a cross section of the main unit and the module unit in the area adjacent to the connection interface.

In FIG. 4b, it is shown that the main housing 11 includes a first main housing section 12 and a second main housing section 13, where the first main housing section 12 is forming the front side FS and the second main housing section 13 is forming the rear side RS. In FIGS. 9 and 10, it is shown that in similar way, the module housing 31 includes a first module housing section 32 and a second module housing section 33. The module housing 31 further includes a module sealing element 52 sealingly engaged between the first module housing section 32 and the second module housing section 33. The module sealing element 52 is oriented in a vertical module sealing plane MSP during operation of the power supply system 1. Hence, when the electric module 40 includes a power converter, the printed circuit board PCB of the electric module 40 will be oriented in parallel with the module sealing plane MSP.

Figure 5:
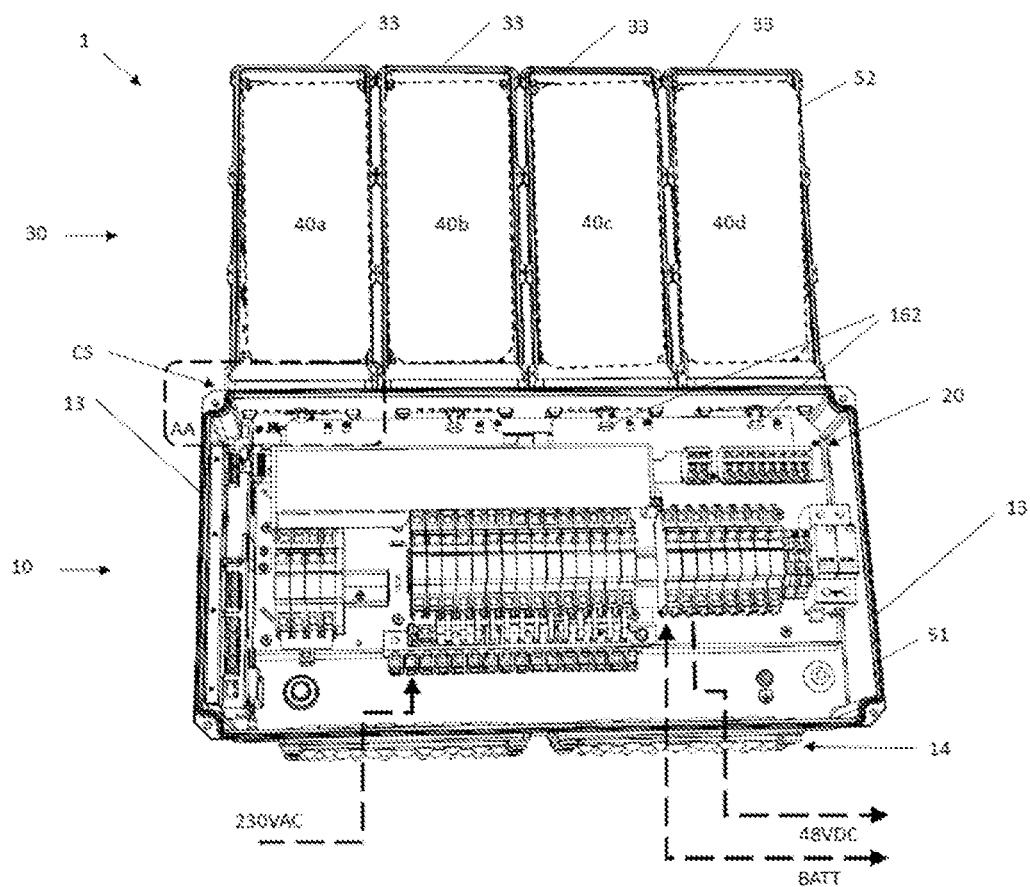
FIG. 5 corresponds to FIG. 3, wherein the upper part of the main housing and the upper part of the respective module housings have been removed.

In FIG. 5, the first main housing section 12 of the main unit 10 and the first module housing sections 32 of the respective module units 30 have been removed.

The distribution circuit 20 may include cable connectors, an electricity breaker module, and a controller for controlling power through the converter(s), for controlling the output voltage, for battery management etc. Cables (illustrated by dashed arrows in FIG. 5) are guided from the outside of the main housing 11 to the inside of the main housing 11 via a cable lead-through 14 provided on the bottom face of the second main housing section 13. The electricity breaker module may include circuit breakers/relays. By means of this location, the cable lead-through 14 will be partially shielded for precipitation by the main housing 11. In one embodiment, the distribution circuit 20 may further include a data communication module. The data communication module may include at least one of a Wi-Fi module and a Bluetooth module.

The power supply system 1 further includes a ventilation device 2. The ventilation device 2 equalizes the air pressure within the housings 11, 31 with the air pressure outside of the housings 11, 31. In addition, also air humidity may be equalized towards the environment by means of the ventilation device 2. The ventilation device 2 may include a membrane, for example an expanded PTFE membrane. Such ventilation devices are sold under the name Gore® Vents and are considered to be well known for a skilled person. The ventilation device 2 may be provided on the rear side of the main housing 11, i.e. on the second main housing section 13. The power supply system 1 also includes one or more mounting openings 3 for mounting the power supply system 1 to a structure, such as a wall, a pole, a tower etc. The mounting openings 3 may be provided on the rear side of the main housing 11, i.e. on the second main housing section 13.

The electric module 40 may typically include an active converter module converting a first type of power to a second type of power by means of actively switched power switches. The input power is typically power from an AC mains, an AC generator or another AC source. The input power is here typically a 230 VAC or 400 VAC alternating at 50 or 60 Hz. However, other alternatives voltage levels are also possible. In other embodiment, the electric module 40 may include an inverter module adapted to convert DC power to AC power.

The input power may alternatively be a DC power, such as a variating DC power from one or more solar panels etc.

The output power may be a controlled DC power or a controlled AC power.

It should also be noted that the converter module may be bi-directional.

In an embodiment, the module housings 31a, 31b, 31c, 31d of the module units 30a, 30b, 30c, 30d may be preferably identical to each other. Hence, the detailed description below will describe one module housing referred to as 31.

In an embodiment, the first connection system CS1 may be identical to the second connection interface CS2, and hence, the detailed description below will describe one connection system referred to as CS. It should be noted that there is one exception, the exception being that in the case that one of the connection systems CSs is used to connect the main unit to a blinding unit 80 instead of a module unit 30, the connection system CS will typically not include the second electrical connector 47, as the blinding unit 80 does not include an electric module.

Figure 15A:
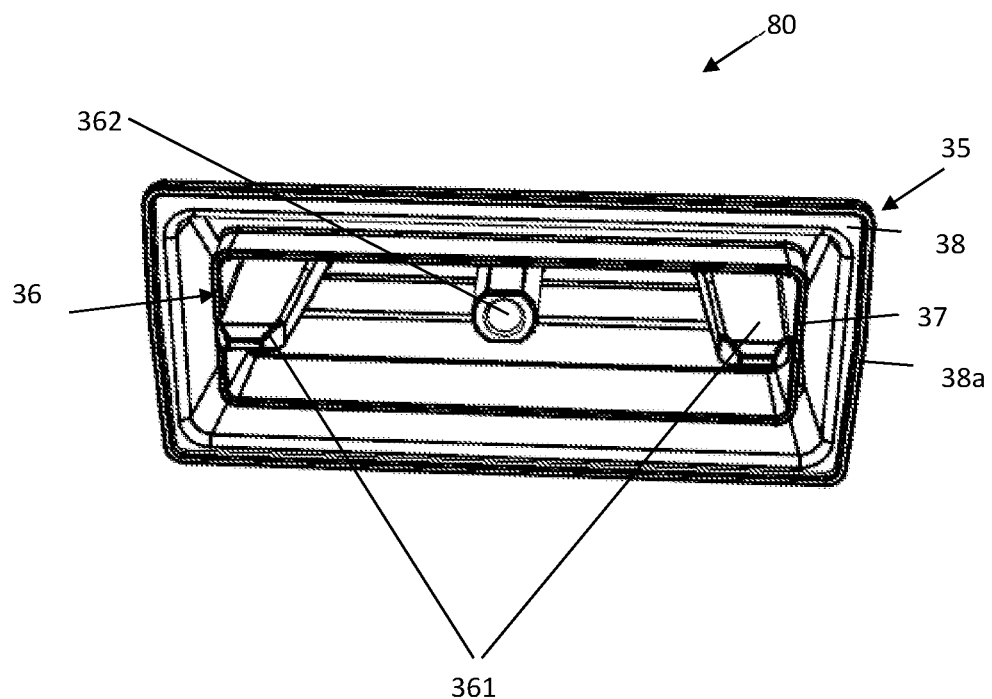
FIG. 15a shows a perspective view from below of a blinding unit.
Figure 15B:
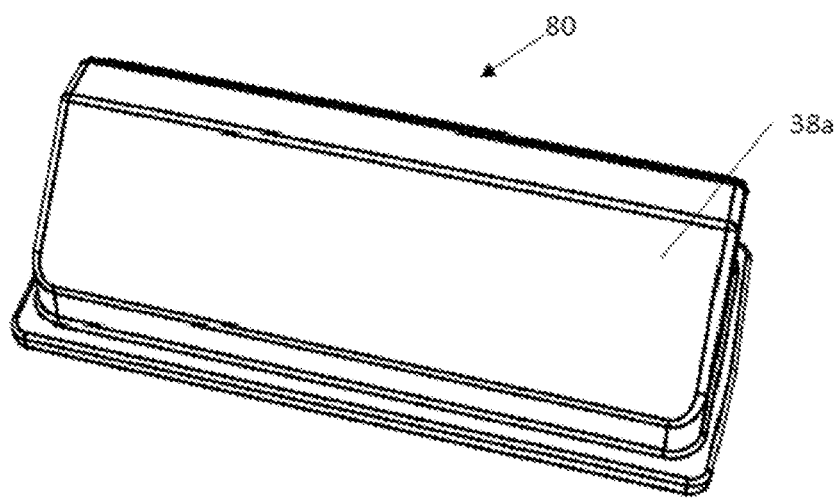
FIG. 15b shows a perspective view from above of the blinding unit.

In one embodiment, the system may include only one, two, three or four such units 30, depending on the expected load connected to the power supply system 1. In case the power supply system 1 includes less than the maximum number of module units 30, the power supply system 1 includes one or more protective blinding units 80 to seal off the available openings of the main unit 10. Such a protective blinding unit 80 is shown in FIGS. 15a and 15b. It should be noted that it is also possible to manufacture a larger main unit 10 to which more than four modules 30 can be connected.

UPS functionality may also be provided by connecting a rechargeable battery to the distribution circuit 20. The rechargeable battery may be located outside of the housings 11, 31. However, in addition to an electric module 40a including a converter module, the power supply system 1 may also include an electric module 40b including a rechargeable battery, i.e. where a rechargeable battery is located within a module housing 31 and being connected to the main unit. An electric module including such a battery is shown in FIG. 14d below as a battery module 85.

In an embodiment, the power supply system 1 is designed for outdoor use, where the electric components of the distribution circuit 20 and the electric module 40 are protected from the outside environment by means of the housings 11, 31. Hence, the main housing 11 is considered to be a protective main housing 11 and the module housing 31 is considered to be a protective module housing 31. The system 1 may for example have an IP65 classification. Sealing elements 51, 52 are therefore provided between the first and second main housing sections 12, 13 and between the first and second module housing sections 32, 33 respectively (shown in FIG. 10). The main unit 10 may be protectively mounted to a structure by means of the mounting devices 3 on the rear side of the main housing 11. In addition, the cable lead-through is a protective cable lead-through 14, i.e. it fulfills the IP65 classification requirement.

The cooling system 70 is a passive cooling system, where the module housing 31 is a part of the cooling system 70, where heat is dissipated from the housing 31 to the environment. Also the main housing 11 may be considered to be a part of the cooling system 70. The module housing 31 (and the main housing 11) is therefore made of a thermally conducting material, such as a metal. Preferably, the housing 11 is made of aluminum or an aluminum alloy. The cooling fins 71 of the passive cooling system may be manufactured together with the module housing in a die casting process or a machining process.

Figure 13:
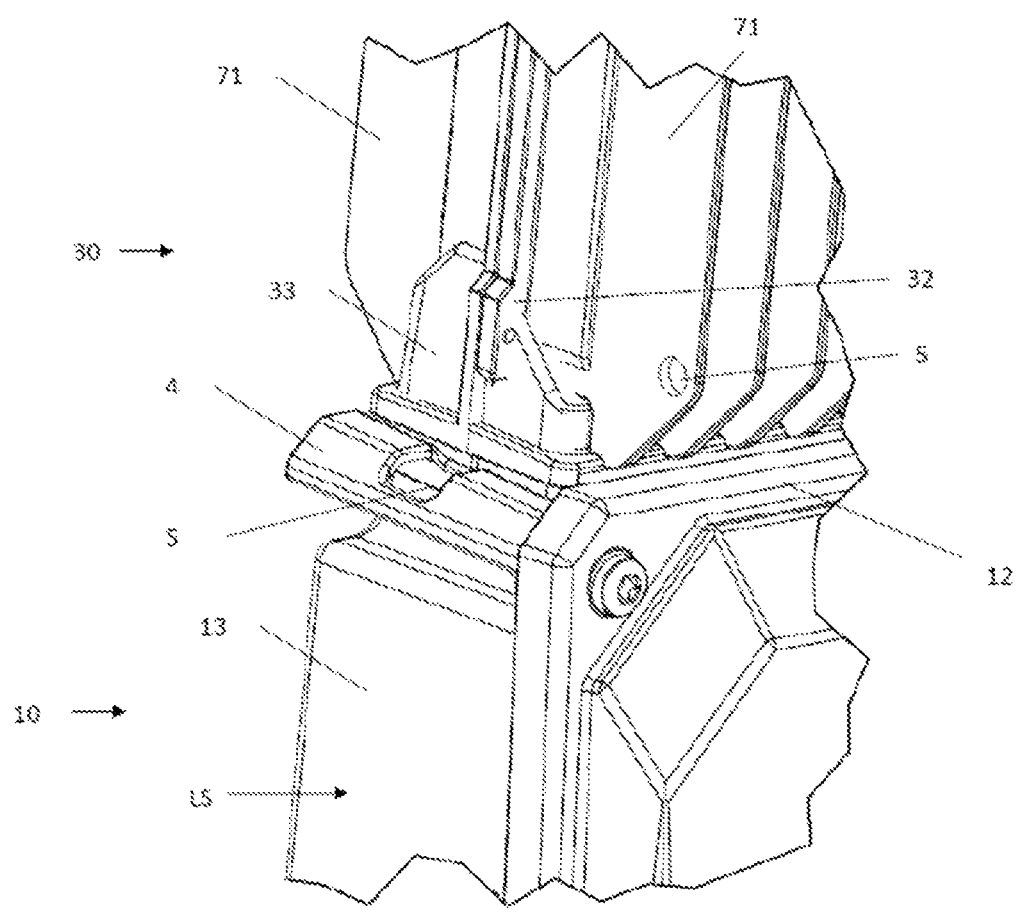
FIG. 13 shows an enlarged view of some details on the left side of the main unit and the module unit.

It is now referred to FIGS. 4b, 6, 11, and 13, where it is shown that the protective main housing 11 includes one or two handles 4 for carrying the main unit 10. Also the protective module housing 31 may include one or two handles for carrying the module unit 30. In FIG. 13, it is shown that the protective main housing 11 and the protective module housing 31 includes carrying openings 5 to which strings, ropes, etc. may be connected, either directly or via a spiral ring, key ring, a carabiner hook etc. Such carrying openings 5 makes it easier to hang off the housings 11, 31 temporarily during installation or reconfiguration of the power supply system 1 above ground.

In the present embodiment, the main unit 10 has a weight of ca 11 kg, while each module unit 30 weights ca 3.3 kg. A "standard" set-up including one main unit 10 and two module units 30 will therefore have a total weight below 25 kg including packaging. In many countries, 25 kg is a maximum weight limit allowed for one person to carry.

Hence, for the same amount of power, the present embodiment has a considerably reduced weight compared to the prior art Chameleon system.

Hence, one person is allowed to carry the respective units and perform the installation of the power supply system 1. If additional module units 30 are needed, they may be handled as separate packages.

Below, the connection system CS between the main unit 10 and the module unit 30 will be described in detail below. It should be noted that in the description below, the connection system CS and other parts of the power supply system 1 will be described as it will be mounted during operation of the power supply system 1, with the axis A1 oriented vertically. With the axis A1 oriented vertically, the cooling system 70 including fins 71 will be able to dissipate heat produced by the power supply system 1 to the environment.

Figure 3B:
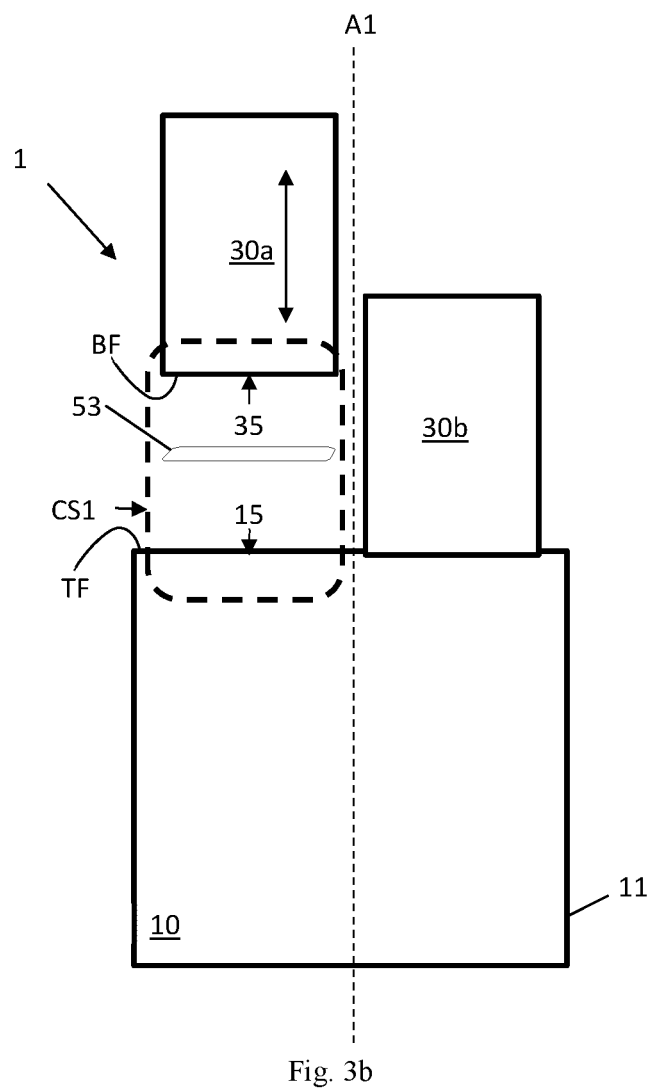
FIG. 3b corresponds to FIG. 3a, where one module unit is disconnected from the main unit and is provided at a distance above the main unit.

It is now referred to FIG. 3b, illustrating the left connection system CS of FIG. 3a. The connection system CS includes a first connector device 15 provided on a top face TF of the protective main housing 11 and a second connector device 35 provided on a bottom face BF of the protective module housing 31. In addition, connection system CS includes a sealing element 53.

Figure 3C:
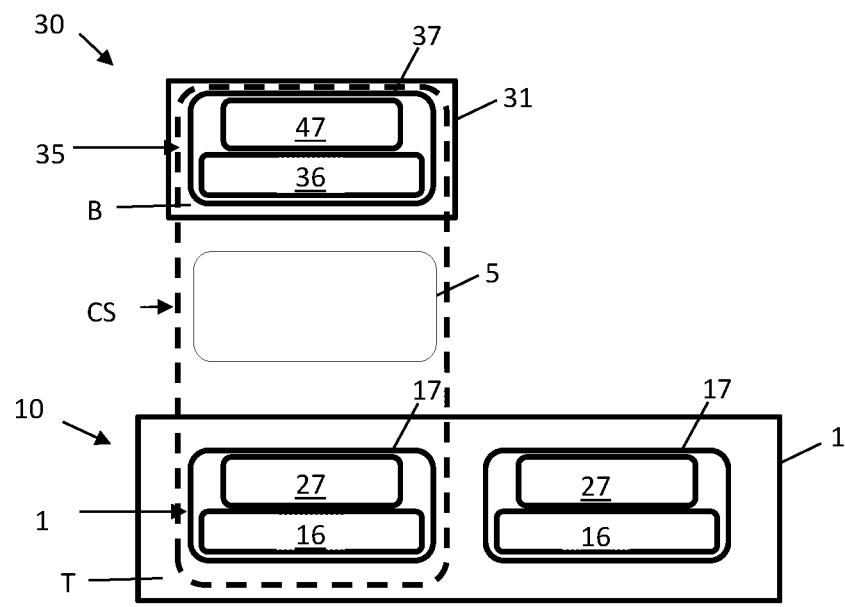
FIG. 3c illustrates schematically a top view of the main unit and a bottom view of one module unit disconnected from each other.

It is now referred to FIG. 3c, showing the bottom face BF of the module unit 30 and the top face TF of the main unit 10. Here it is shown that the first connector device 15 includes a first mechanical connector 16 secured to the protective main housing 11, a first electrical connector 27 connected to the distribution circuit 20 and a first sealing surface 17 circumferentially surrounding the first mechanical connector 16 and the first electrical connector 27. In similar ways, the second connector device 35 includes a second mechanical connector 36 secured to the protective module housing 31, a second electrical connector 47 connected to the converter module 40 and a second sealing surface 37 circumferentially surrounding the mechanical connector 36 and the electrical connector 47.

When the module unit 30 and the main unit 10 are connected to each other, the first mechanical connector 16 and the second mechanical connector 36 are connected to each other and the first electrical connector 27 and the second electrical connector 47 are connected to each other. In addition, the sealing element 53 is sealingly engaged between the first and second sealing surfaces 17, 37.

The Connection System CS of the Module Unit 30

Figure 8:
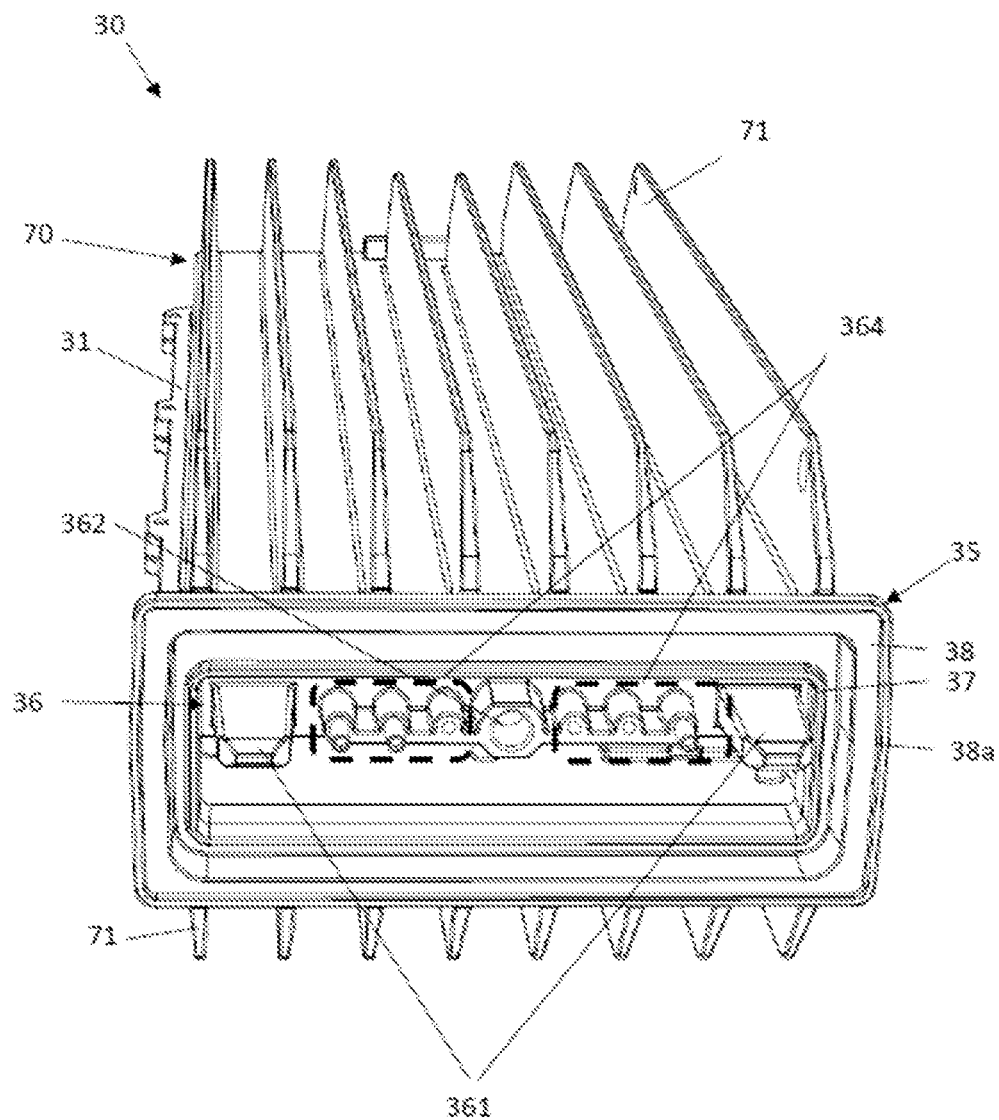
FIG. 8 is a perspective view from below of the module unit with a second connection device of the connection interface, wherein only the mechanical connector is shown.

It is now referred to FIG. 8, where the module unit 30 is shown. Here, it is shown that the second mechanical connector 36 includes a securing opening 362. In this embodiment, the securing opening 362 is a threaded opening. The second mechanical connector 36 further includes two guiding elements 361 provided at a distance from each other and provided at a distance from the securing opening 362.

FIG. 9 corresponds to FIG. 8, but here, the second electrical connector 47 is also shown. The second electrical connector 47 includes a number of power connectors for transferring electric power into and out from the module 40, and one or more communication connectors for transferring control signals and sensor signals between the module 40 and the controller of the distribution circuit 20.

In FIG. 8, between the guiding elements 361 and the securing opening 362, the second mechanical connector 36 includes a second part of a mechanical coding system, indicated as 364. The mechanical coding system 364 includes pin openings, wherein pins can be inserted. In FIG. 8, pins are present in positions 1, 2 and 6 (from left to right), while no pins are present in positions 3, 4 and 5.

It is now referred to FIG. 9. The second sealing surface 37 is provided as a part of the protective module housing 31 circumferentially surrounding the second mechanical connector 36 and the second electrical connector 47.

Figure 12:
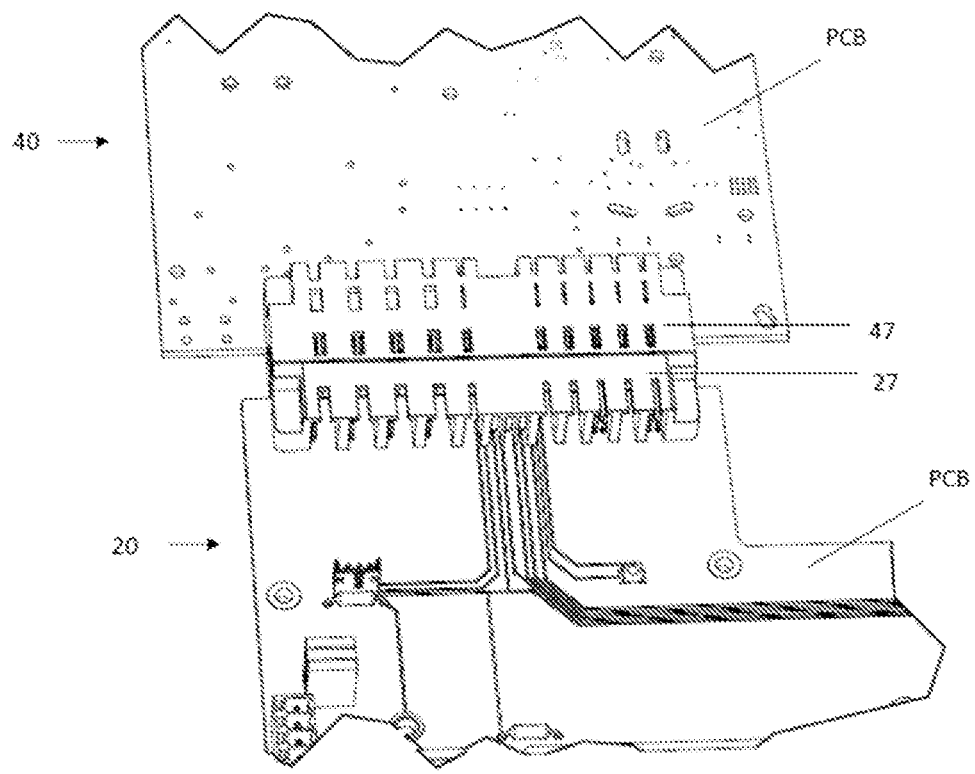
FIG. 12 is an enlarged view of the electrical connectors of the connection interface.

In FIGS. 9, 10, and 12, it is shown that the second sealing surface 37 is provided as a ridge 37a protruding from the second protecting housing 31 in a direction towards the main housing 11. The ridge 37a is intended to be in contact with the sealing element 53 when the module unit 30 is assembled with the main unit 10.

It is also shown that the second connector device 35 includes a second heat-conducting element 38 circumferentially surrounding the second sealing surface 37. Also the second heat-conducting element 38 is provided as a part of the protective module housing 31.

The second connector device 35 further includes a lip 38a circumferentially surrounding the second heat-conducting element 38, wherein the lip 38a is protruding in the axial direction A1 away from the second heat-conducting element 38.

The second connector device 35 may include a second ventilation channel 39 (FIG. 9) or several ventilation channels.

The Connection System CS of the Main Unit 10

Figure 6:
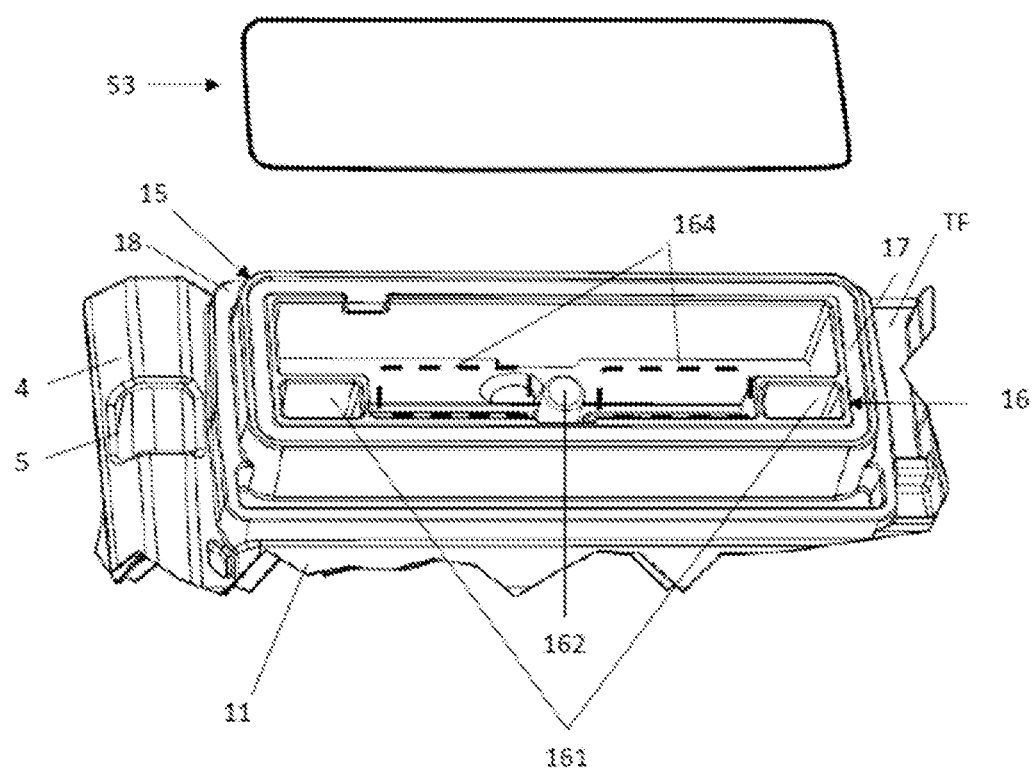
FIG. 6 illustrates the area AA of the main unit shown in FIG. 5 with a first connection device of a connection interface, wherein only the mechanical connector is shown.

It is now referred to FIG. 6, showing a part of the top face TF of the main unit 10. Here it is shown that the first mechanical connector 16 includes a securing element 162. In this embodiment, the securing element 162 includes a threaded bolt or screw adapted to be secured to the securing opening 362. The first mechanical connector 16 further includes two guiding openings 161 adapted to receive the guiding element 361.

In FIG. 5 and in FIG. 10, it is shown that the securing element 162 is accessible from within the main housing 11.

Figure 7:
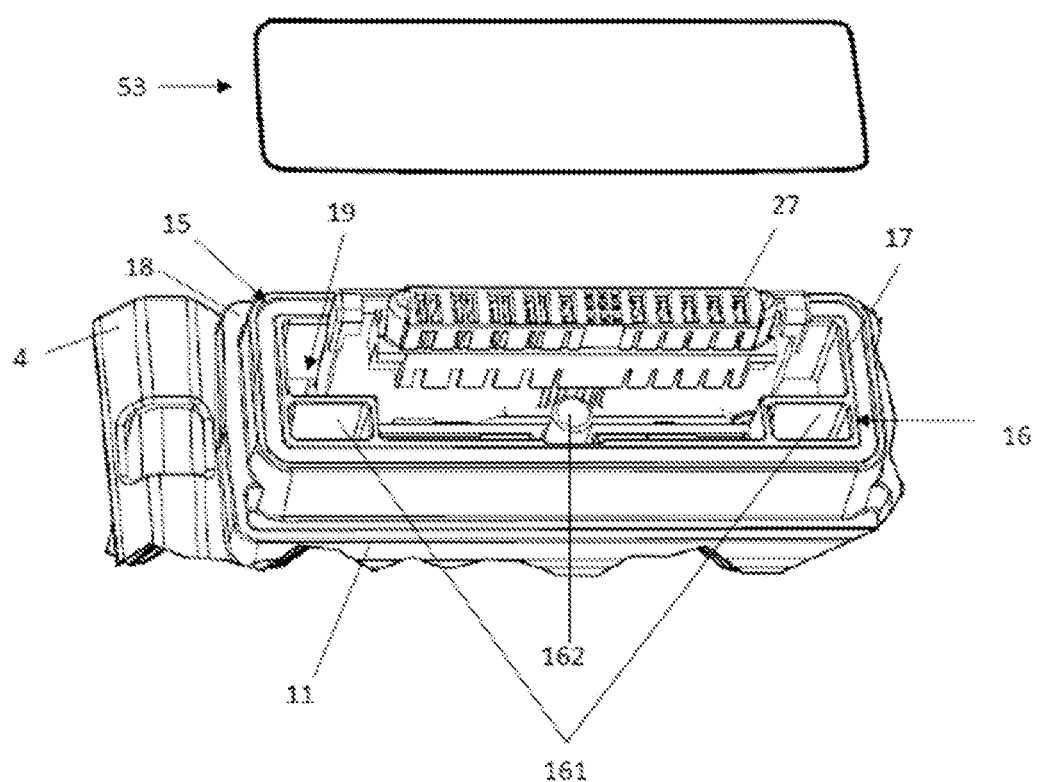
FIG. 7 corresponds to FIG. 6, here the mechanical connector and the electrical connector of the first connection device are shown.

FIG. 7 corresponds to FIG. 6, but here, the first electric connector 27 is shown. The first electric connector 27 is adapted to be connected to the second electric connector 47.

In FIG. 6, between the guiding openings 161 and the securing element 162, the first mechanical connector 16 includes a first part of the mechanical coding system, indicated as 164. The first mechanical coding system 164 includes pin openings, which can be open or blocked. A pin of the second mechanical coding system 364 will fit into an open pin opening of the first mechanical coding system 164, but will not fit into a blocked pin opening of the first mechanical coding system 164.

Hence, in one embodiment, if the first part of the mechanical coding system fits the second part of the mechanical coding system, it is possible to connect the module unit 30 to the main unit 10. However, if the first part of the mechanical coding system does not fit the second part of the mechanical coding system, it is not possible to connect the module unit 30 to the main unit 10.

One reason for such a mechanical coding system is related to safety. As an example, a 48 VDC output voltage of the power supply system will require a different fuse in the distribution circuit 20 of the main unit 10 than a 400 VDC output voltage. Moreover, connecting a 48 VDC module into a 400 VDC system will cause damage to components (capacitors, semiconductors etc.) within the 48 VDC module. Hence, by means of this mechanical coding system, it is possible to avoid that a converter module having an output voltage of 48 VDC is connected to main unit 10 of a power supply system dimensioned to output 400 VDC only (or vice versa).

In FIG. 7, it is shown that the first sealing surface 17 is provided as part of the protective main housing 11 circumferentially surrounding the first mechanical connector 16 and the first electrical connector 27. The first sealing surface 17 is provided as a groove 17a (FIG. 10) intended to be in contact with the sealing element 53 when the module unit 30 is assembled with the main unit 10.

It is also shown that the first connector device 15 includes a first heat-conducting element 18 circumferentially surrounding the first sealing surface 17. Also the first heat-conducting element 18 is provided as a part of the main housing 11.

The first connector device 15 may also include a first ventilation channel 19 (FIG. 7) aligned with the first ventilation channel 39 when the module unit 30 and the main unit 10 are connected to each other.

Assembly Operation

The operation of connecting the module unit 30 to the main unit 10 will now be described in detail.

However, first the mounting of the main unit 10 will be described shortly, as this is the first step of mounting and installing the power supply system 1. In a first step, the first and second main housing sections 11a, 11b are released from each other. The distribution circuit 20 is secured to the second main housing section 11b. The second main housing section 11b (together with the distribution circuit 20) is now mounted to a structure by means of the above mounting openings 3 with its rear side RS facing towards the structure and its top surface TS facing upwardly and the cable lead-through 14 facing downwardly.

Cables may now be guided through the cable lead-through 14 and connected to the distribution circuit 20.

If already not in place, the sealing element 53 is inserted into the groove 17a forming the first sealing surface groove 17.

The module unit 30 does not need any assembly/disassembly at this stage. However, a temporary cover may be provided on both the main unit 10 and the module unit 30 for protection during transportation and storage. These temporary covers are now removed.

The module unit 30 is now lifted onto the main unit 10 with its bottom face BF facing downwardly. By inserting the guiding elements 361 into the guiding openings 161, the module unit 30 will be correctly positioned with respect to the main unit 10.

The securing element 162 is now secured to the securing opening 362. In FIG. 10 the securing element 162 is shown both in its lower, disconnected position and its upper, connected and secured position.

The sealing element 53 will now be sealingly engaged in the groove 17a as the ridge 37a will press the sealing element 53 between the first and second sealing surfaces 17, 37.

In FIG. 12 it is shown how the first electrical connector 27 and the second electrical connector 47 are connected to each other.

Figure 11:
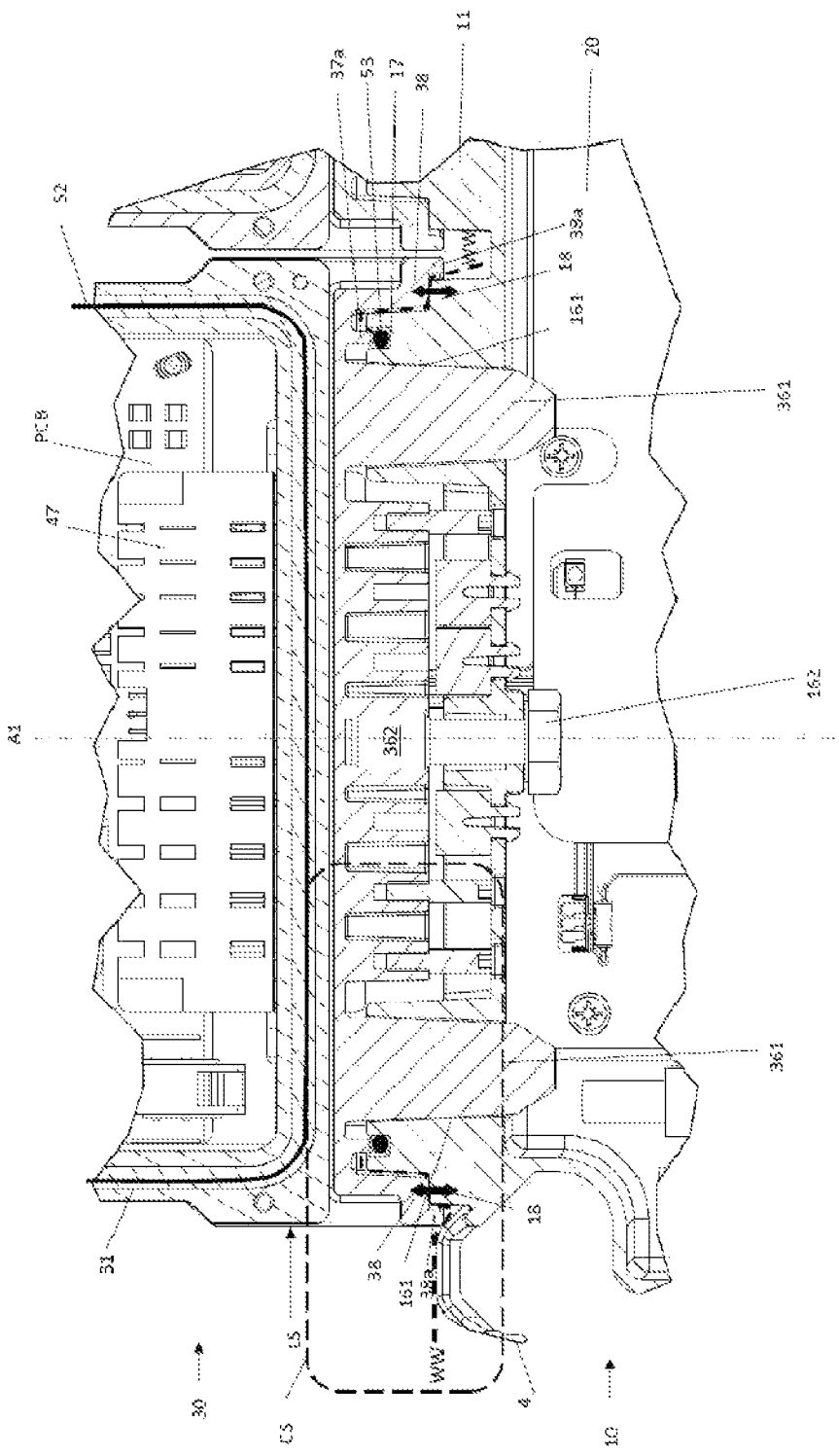
FIG. 11 is a cross section taken perpendicular to the cross section of FIG. 10.

In FIGS. 10 and 11 it is also shown how the first heat conducting element 18 and the second heat-conducting element 38 are pressed into contact with each other. It should be noted that this contact interface is provided vertically below the sealing element 53. Moreover, it is also shown how the lip 38a is circumferentially surrounding the second heat-conducting element 38, and also parts of the first heat-conducting element 18.

This has two purposes: First, heat may be transferred between the main housing 11 and the module housing 31 via the first and second heat conducting elements 18, 38. Second, moisture and dust are prevented from reaching the sealing element 53. This is illustrated by a water-way WW indicating how water has to flow upwardly on the outside of the first heat conducting element 18 and inside the lip 38a, then between the first and second heat conducting elements 18, 38. Then, if water gets so far, the water must further flow upwardly again and into the groove 17a, where the sealing element 53 is located. Hence, the above features of the connection system CS are considered to protect the inside of the housings 11, 31 from water, dust and other weather conditions.

The ventilation channels 19, 39 also allows air to flow between the main housing 11 and the module housing 39. This is indicated as a dashed arrow AF (Air Flow) in FIG. 10.

Then other module units 30 may be connected to the main unit 10. In the examples above, there may be two or four such module units 30 connected to one main unit 10. However, other options are also possible. Moreover, it is also possible to connect only one module unit 30 to the main unit 10 and then blind the remaining openings in the top surface TS of the main unit 10.

In a final step, the first main housing section 11a is secured to the second main housing section 11b.

In addition to those mentioned above, there are more advantages of this connection system CS. As shown in FIG. 12, both the distribution circuit 20 and the converter module 40 typically includes electric and electronic components soldered to a printed circuit board PCB. Such printed circuit boards and the soldering thereon will easily be damaged if they are bent. According to the mechanical connection system of the power supply system above, mechanical rigidity is ensured.

It should also be noted that the above connection system CS makes it easy to reconfigure the power supply system 1, by replacing one module unit 30 with another module unit 30 (for example due to malfunctioning), to add an additional module unit or to remove one of several module units (if the expected load increases or decreases).

Another advantage is that the first electrical connector 27 may be touch proof. Consequently, an operator may connect the first and second connector devices 15, 35 to each other or disconnect the first and second connector devices 15, 35 from each other, even if the distribution circuit 20 is supplied with power.

Another advantage is that as the securing element 162 is only accessible from within the main housing, the risk of theft or tampering is reduced.

It is now referred to FIGS. 14a-g. Here different non-limiting configurations of the power supply system 1 is shown. The loads are here illustrated as a 5$^{th}$ generation (5G) mobile network station "5G" or as a generic load "L".

Figure 14A:
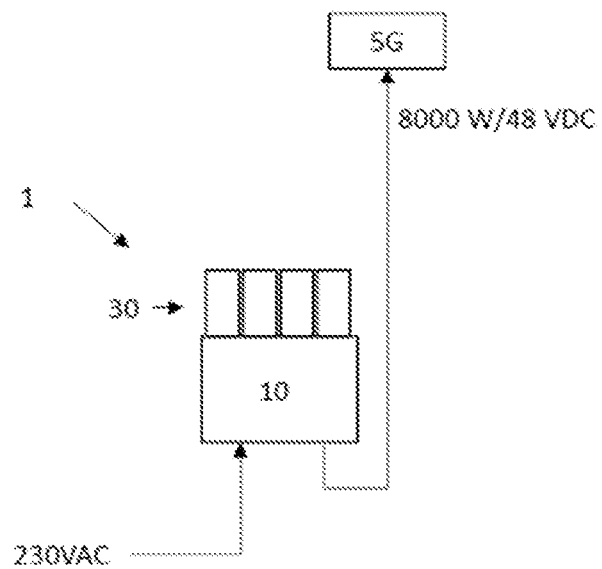
FIG. 14a-g shows some examples of different configurations of the power supply system.

In FIG. 14a, the power supply system 1 includes four identical converter module units 30 connected to the main unit 10, the power supply system 1 being each capable of outputting 8000 W at 48 VDC based on a 230 VAC power input (i.e. each converter module unit 30 supplying up to 2000 W).

Figure 14B:
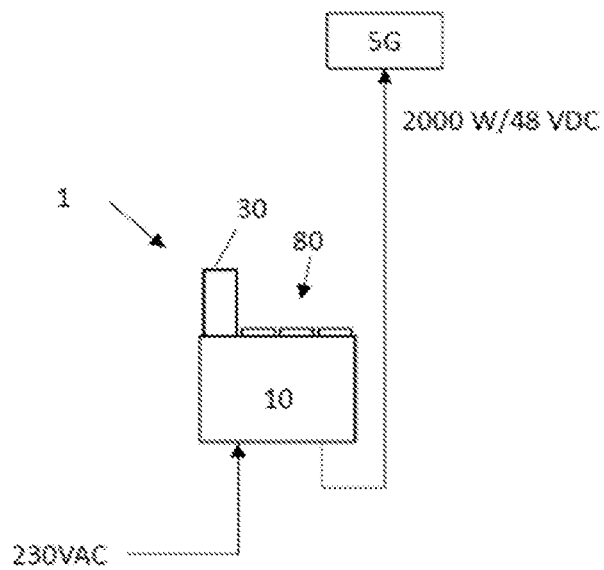

In FIG. 14b, the power supply system 1 includes one converter module unit 30 and three blinding units 80 connected to the main unit. Here, the power supply system 1 is capable of outputting up to 2000 W at 48 VDC based on a 230 VAC power input.

Figure 14C:
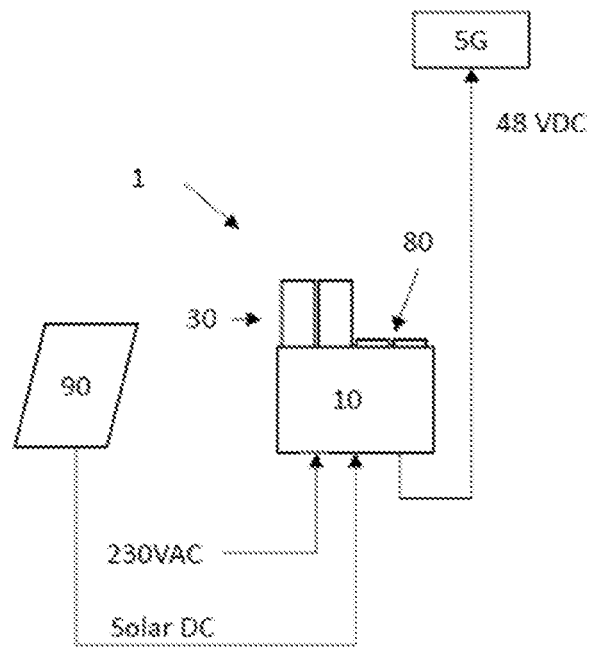
Figure 14D:
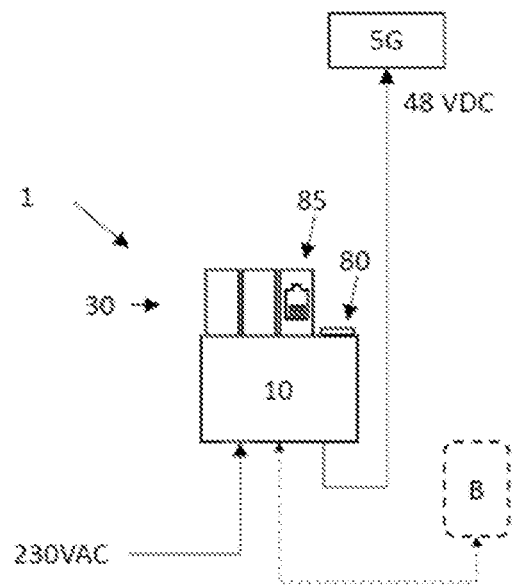

In FIG. 14c, the power supply system 1 includes two different converter module units 30, one outputting up to 2000 W at 48 VDC based on a solar DC power input received from a solar panel system 90 and one outputting up to 2000 W at 48 VDC based on a 230 VAC power input.

In FIG. 14d, the power supply system 1 includes two converter module units 30 of the type shown in FIG. 14a and one blinding unit 80 connected to the main unit 10. Here the power supply system may output up to 4000 W at 48 VDC. The power supply system 1 further includes a battery module unit 85. Hence, this power supply system 1 has UPS functionality and may supply power to the load even if the 230 VAC input power should fail for a shorter period of time. As indicated with dashed lines in FIG. 14d, a rechargeable battery B may also be connected to the power supply system 1 via the cable lead-through 14.

Figure 14E:
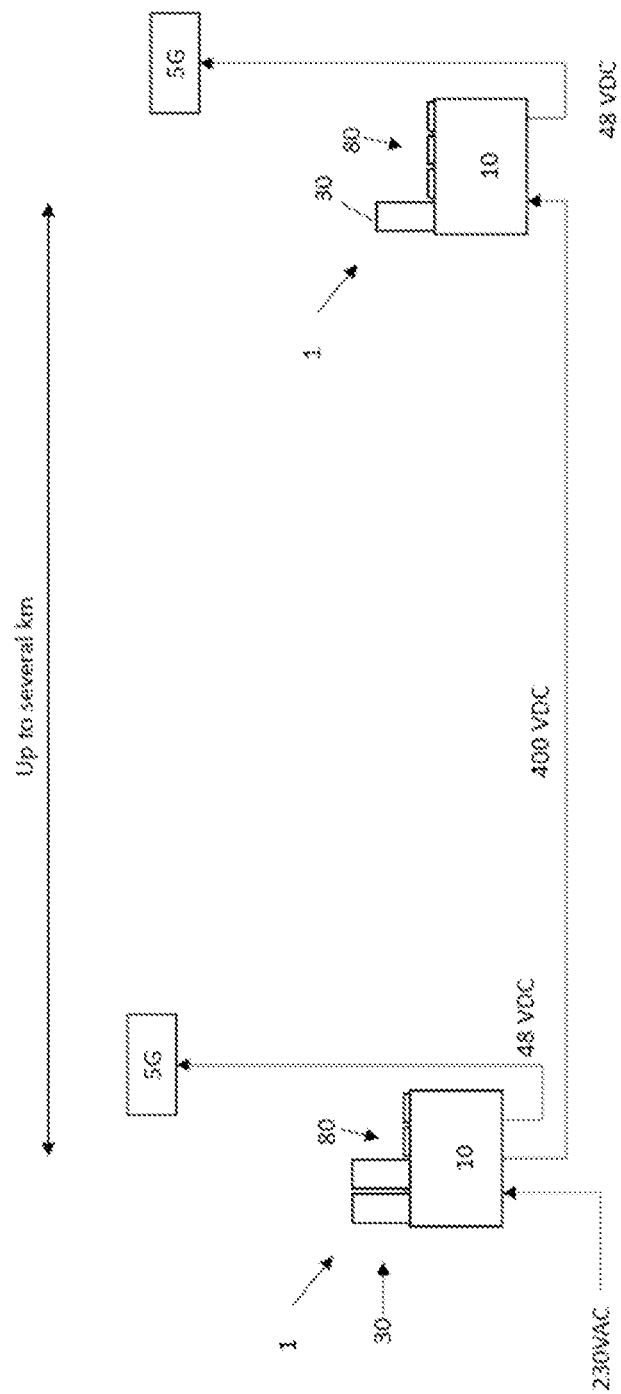

In FIG. 14e, there are two power supply systems 1. The left power supply system 1 includes one converter module unit 30 outputting 48 VDC and one converter module unit 30 outputting 400 VDC. In addition, it includes two blinding units 80. The 48 VDC output is supplied to a load adjacent to the left power supply system 1, while the 400 VDC output is supplied to the right power supply system 1. The right power supply system 1 includes one converter module unit 30 converting the 400 VDC input to a 48 VDC output, which is supplied to a load adjacent to the right power supply system 1.

The example of FIG. 14e may be relevant for buildings, towers etc., where existing power distribution cables can be used between the left and right power supply systems 1 as an alternative to installing a new power distribution cable. This is often referred to as "remote feeding".

Figure 14F:
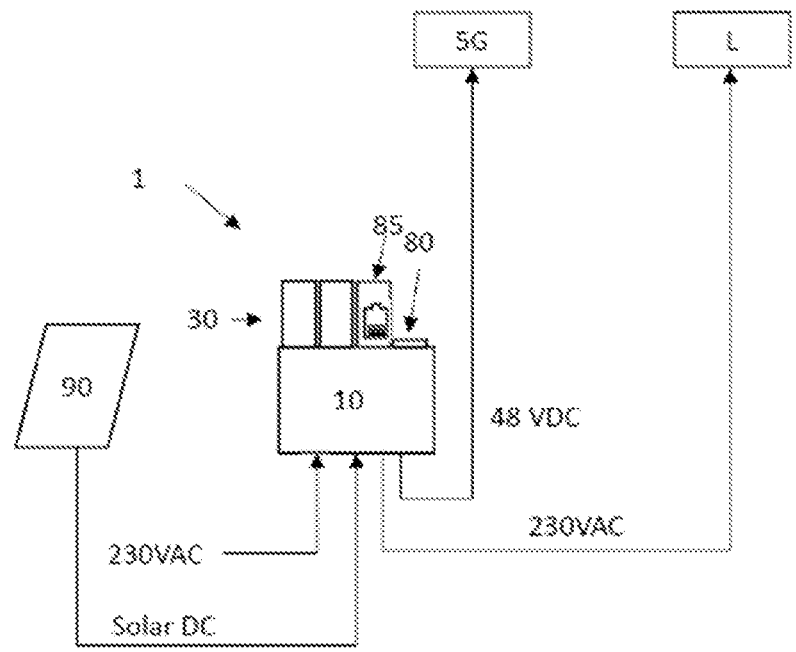

In FIG. 14f, the power supply system 1 includes a first converter module unit 30 outputting up to 2000 W at 48 VDC based on a solar DC power input received from a solar panel system 90 (similar to FIG. 14c) and one bidirectional converter module unit 30 which inputs 230 VAC and outputs both 230 VAC and 48 VDC. One such bidirectional converter module unit 30 may be based on the ELTEK Rectiverter® technology, which is considered known for a person skilled in the art. In addition, the power supply system 1 includes a rechargeable battery module unit 85 and a blinding unit 80.

Figure 14G:
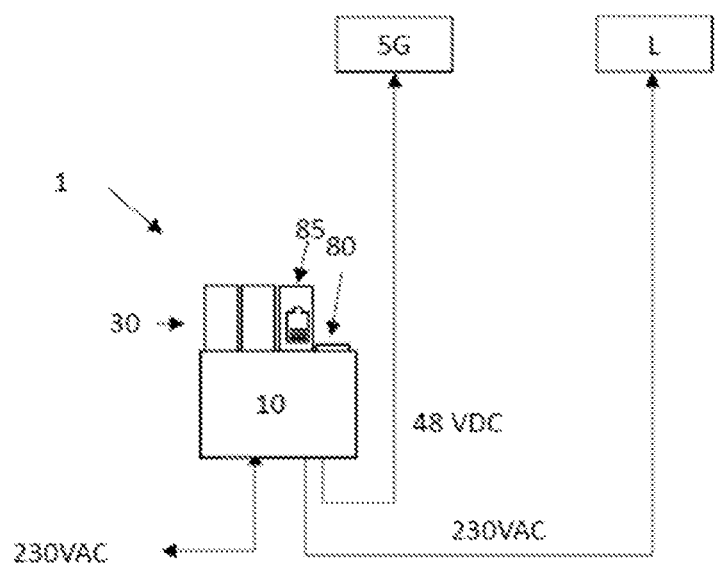

In FIG. 14g, the power supply system 1 includes two bidirectional converter modules 30, one rechargeable battery module unit 85 and a blinding unit 80. This power supply system 1 may be preferred near solar power plants, wind turbine plants, in areas with weak power distribution lines etc. The load L may here be lightning systems, 5G 230 VAC equipment or other types of 230 VAC loads installed in or adjacent to the 5G equipment.

In areas with weak power distribution lines, there is often a lack of reactive power, and the voltage may decrease to a level below the desired voltage level. The power supply system 1 may then feed reactive power from the battery and maintain the desired voltage level.

In areas near solar power plants, there may be periods with excessive reactive power causing the voltage to increase. The power supply system 1 may then consume reactive power to lower the voltage.

In areas with wind turbines may experience frequency variations when wind is decreasing. The power supply system 1 may here supply active power to the distribution network and hence help maintaining frequency until slower frequency regulating means becomes operative. Of course, more than one such power supply system 1 should be installed in this area for such purposes.

The above battery module unit may be charged when energy costs are low and may supply power to the grid and/or load 5G, L when prices are high.

In the description below, the sealing elements 51, 52, 53 may be made of natural rubber materials, synthetic rubber materials, thermoplastic materials and other materials commonly known used for seals, such as o-rings, gaskets etc.

It should be noted that in the description above, the voltage levels are examples only. Moreover, the voltage levels are expressed as system voltages-a 48 VDC system voltage may have an actual voltage between 60 VDC and 40 VDC under different operating conditions. It should also be noted that the power is expressed as examples only.

What is claimed is:

1. A power supply system with protective design against outdoor environment, comprising:
   a main unit comprising a protective main housing and a distribution circuit disposed in the protective main housing;
   a first module unit comprising a first protective module housing and a first electric module disposed in the first protective module housing;
   a passive cooling system for cooling of the main unit and the first module unit;
   a first protective connection system; and
   a second protective connection system, wherein the first protective connection system comprises a first connector device, a second connector device, and a sealing element to provide a releasable electrical and mechanical connection between the main unit and the first module unit;
   wherein the passive cooling system comprises cooling fins disposed on an outer surface of the first protective module housing;
   wherein the first connector device comprises:
      a first mechanical connector configured to be secured to the protective main housing;
      a first electrical connector configured to be connected to the distribution circuit; and
      a first sealing surface circumferentially surrounding the first mechanical connector and the first electrical connector;
   wherein the second connector device comprises:
      a second mechanical connector configured to be secured to the first protective module housing;
      a second electrical connector configured to be connected to the first electric module; and
      a second sealing surface circumferentially surrounding the second mechanical connector and the second electrical connector.

2. The power supply system according to claim 1, wherein the power supply system further comprises:
   a second module unit comprising a second protective module housing and a second electric module disposed in the second protective module housing, wherein the second protective connection system is configured to provide a releasable electrical and mechanical connection between the main unit and the second module unit.

3. The power supply system according to claim 1, wherein the first module unit comprises a converter module unit, wherein the first electric module comprises an active power converter for converting one type of power to another type of power.

4. The power supply system according to claim 2, wherein the second module unit comprises at least one of a battery module unit and a converter module unit, wherein the second electric module comprises at least one of a rechargeable battery and an active power converter for converting one type of power to another type of power.

5. The power supply system according to claim 2, wherein at least one of the first protective module housing and the second protective module housing comprises:
   a first module housing section;
   a second module housing section; and
   a module sealing element sealingly engaged between the first module housing section and the second module housing section, where the module sealing element is oriented in a vertical module sealing plane (MSP) during operation of the power supply system.

6. The power supply system according to claim 1, wherein the power supply system is configured to allow at least one of the following during operation of the power supply system:
   connect a further module unit to the main unit;
   disconnect a module unit from the main unit.

7. The power supply system according to claim 1, wherein the module unit is mechanically secured to the main unit by means of a securing element accessible from the inside of the main housing.

8. The power supply system according to claim 1, wherein the protective module housing is made of a thermally conducting material and is a part of the cooling system.

9. The power supply system according to claim 1, wherein when the first module unit and the main unit are connected to each other:
   the first and second mechanical connectors are connected to each other;
   the first and second electrical connectors are connected to each other; and
   the sealing element is sealingly engaged between the first and second sealing surfaces.

10. The power supply system according to claim 9, wherein:
    the second mechanical connector comprises a securing opening;
    the first mechanical connector comprises a securing element being secured to the securing opening when the first module unit and the main unit are connected to each other;
    the securing element is accessible from within the protective main housing.

11. The power supply system according to claim 9, wherein:
    the first mechanical connector comprises a guiding opening;
    the second mechanical connector comprises a guiding element being inserted into to the guiding opening when the first module unit and the main unit are connected to each other.

12. The power supply system according to claim 9, wherein the first sealing surface is provided as a part of the protective main housing and the second sealing surface is provided as a part of the first protective module housing.

13. The power supply system according to claim 12, wherein:
    the first sealing surface is provided as part of a groove in the protective main housing;
    the second sealing surface is provided as a ridge protruding from the first protective module housing.

14. The power supply system according to claim 9, wherein:
    the first connector device comprises a first heat-conducting element;
    the second connector device comprises a second heat-conducting element;
    wherein the first and second heat-conducting elements are provided in contact with each other when the first module unit and the main unit are connected to each other.

15. The power supply system according to claim 14, wherein the first heat-conducting element is provided as a part of the protective main housing and the second heat-conducting element is provided as a part of the first protective module housing.

16. The power supply system according to claim 2, wherein at least one of the first module unit and the second module unit comprises at least one of a first converter module unit for converting alternating current (AC) power to direct current (DC) power and a second converter module unit for converting DC power to AC power.

17. The power supply system according to claim 1, wherein the distribution circuit comprises at least one of an electricity breaker module and a data communication module.

* * * * *